US011669658B2

(12) United States Patent
Crabtree et al.

(10) Patent No.: US 11,669,658 B2
(45) Date of Patent: *Jun. 6, 2023

(54) SYSTEM AND METHODS FOR MULTI-LANGUAGE ABSTRACT MODEL CREATION FOR DIGITAL ENVIRONMENT SIMULATIONS

(71) Applicant: QOMPLX, Inc., Tysons, VA (US)

(72) Inventors: Jason Crabtree, Vienna, VA (US); Andrew Sellers, Monument, CO (US)

(73) Assignee: QOMPLX, INC., Tysons, VA (US)

( * ) Notice: Subject to any disclaimer, the term of this patent is extended or adjusted under 35 U.S.C. 154(b) by 148 days.

This patent is subject to a terminal disclaimer.

(21) Appl. No.: 17/333,251

(22) Filed: May 28, 2021

(65) Prior Publication Data

US 2021/0397766 A1    Dec. 23, 2021

Related U.S. Application Data

(63) Continuation of application No. 15/835,312, filed on Dec. 7, 2017, now Pat. No. 11,055,451, which is a continuation-in-part of application No. 15/186,453, filed on Jun. 18, 2016, now abandoned, which is a continuation-in-part of application No. 15/166,158, filed on May 26, 2016, now abandoned, which is a continuation-in-part of application No. 15/141,752, filed on Apr. 28, 2016, now Pat. No. 10,860,962, which is a continuation-in-part of application No.
(Continued)

(51) Int. Cl.
| | | |
|---|---|---|
| G06F 30/20 | (2020.01) | |
| H04L 67/02 | (2022.01) | |
| G06F 9/448 | (2018.01) | |
| G06F 8/10 | (2018.01) | |
| G06N 7/01 | (2023.01) | |
| G06Q 10/0637 | (2023.01) | |
| G06N 5/01 | (2023.01) | |

(52) U.S. Cl.
CPC ............... *G06F 30/20* (2020.01); *G06F 8/10* (2013.01); *G06F 9/448* (2018.02); *G06N 7/01* (2023.01); *G06Q 10/0637* (2013.01); *H04L 67/02* (2013.01); *G06N 5/01* (2023.01)

(58) Field of Classification Search
CPC ........ G06F 9/448; G06N 7/005; G06N 5/003; H04L 67/02
See application file for complete search history.

(56) References Cited

U.S. PATENT DOCUMENTS

| | | |
|---|---|---|
| 5,669,000 A | 9/1997 | Jessen et al. |
| 6,256,544 B1 | 7/2001 | Weissinger |
| | (Continued) | |

FOREIGN PATENT DOCUMENTS

| | | |
|---|---|---|
| CN | 105302532 B | 6/2018 |
| WO | 2014159150 A1 | 10/2014 |
| WO | 2017075543 A1 | 5/2017 |

*Primary Examiner* — Kevin W Figueroa
(74) *Attorney, Agent, or Firm* — Galvin Patent Law LLC; Brian R. Galvin

(57) ABSTRACT

A system and methods for multi-language abstract digital simulation model generation and execution, comprising a meta-model structuring and creation system, meta-model mapping table, remote server, simulation execution process, computer domain specific language, and methods for user-creation and editing of meta-models, simulation models, and parametrization of simulation environments, actors, objects, and events in real-time using heuristic searching.

12 Claims, 13 Drawing Sheets

Related U.S. Application Data

15/091,563, filed on Apr. 5, 2016, now Pat. No. 10,204,147, and a continuation-in-part of application No. 14/986,536, filed on Dec. 31, 2015, now Pat. No. 10,210,255, and a continuation-in-part of application No. 14/925,974, filed on Oct. 28, 2015, now abandoned.

(56) References Cited

U.S. PATENT DOCUMENTS

| | | |
|---|---|---|
| 6,477,572 B1 | 11/2002 | Elderton et al. |
| 7,072,863 B1 | 7/2006 | Phillips et al. |
| 7,657,406 B2 | 2/2010 | Tolone et al. |
| 7,698,213 B2 | 4/2010 | Lancaster |
| 7,739,653 B2 | 6/2010 | Venolia |
| 8,065,257 B2 | 11/2011 | Kuecuekyan |
| 8,145,761 B2 | 3/2012 | Liu et al. |
| 8,281,121 B2 | 10/2012 | Nath et al. |
| 8,615,800 B2 | 12/2013 | Baddour et al. |
| 8,788,306 B2 | 7/2014 | Delurgio et al. |
| 8,793,758 B2 | 7/2014 | Raleigh et al. |
| 8,914,878 B2 | 12/2014 | Burns et al. |
| 8,997,233 B2 | 3/2015 | Green et al. |
| 9,134,966 B2 | 9/2015 | Brock et al. |
| 9,141,360 B1 | 9/2015 | Chen et al. |
| 9,231,962 B1 | 1/2016 | Yen et al. |
| 9,602,530 B2 | 3/2017 | Ellis et al. |
| 9,654,495 B2 | 5/2017 | Hubbard et al. |
| 9,672,355 B2 | 6/2017 | Titonis et al. |
| 9,686,308 B1 | 6/2017 | Srivastava |
| 9,762,443 B2 | 9/2017 | Dickey |
| 9,887,933 B2 | 2/2018 | Lawrence, III |
| 9,946,517 B2 | 4/2018 | Talby et al. |
| 10,061,635 B2 | 8/2018 | Ellwein |
| 10,102,480 B2 | 10/2018 | Dirac et al. |
| 10,210,246 B2 | 2/2019 | Stojanovic et al. |
| 10,210,255 B2 | 2/2019 | Crabtree et al. |
| 10,242,406 B2 | 3/2019 | Kumar et al. |
| 10,248,910 B2 | 4/2019 | Crabtree et al. |
| 10,318,882 B2 | 6/2019 | Brueckner et al. |
| 10,367,829 B2 | 7/2019 | Huang et al. |
| 10,511,498 B1 | 12/2019 | Narayan et al. |
| 2003/0041254 A1 | 2/2003 | Challener et al. |
| 2003/0145225 A1 | 7/2003 | Bruton et al. |
| 2005/0289072 A1 | 12/2005 | Sabharwal |
| 2007/0150744 A1 | 6/2007 | Cheng et al. |
| 2009/0089227 A1 | 4/2009 | Sturrock et al. |
| 2009/0182672 A1 | 7/2009 | Doyle |
| 2009/0222562 A1 | 9/2009 | Liu et al. |
| 2009/0293128 A1 | 11/2009 | Lippmann et al. |
| 2011/0087888 A1 | 4/2011 | Rennie |
| 2011/0154341 A1 | 6/2011 | Pueyo et al. |
| 2012/0266244 A1 | 10/2012 | Green et al. |
| 2013/0073062 A1 | 3/2013 | Smith et al. |
| 2013/0132149 A1 | 5/2013 | Wei et al. |
| 2013/0191416 A1 | 7/2013 | Lee et al. |
| 2013/0246996 A1 | 9/2013 | Duggal et al. |
| 2013/0304623 A1 | 11/2013 | Kumar et al. |
| 2014/0156806 A1 | 6/2014 | Karpistsenko et al. |
| 2014/0244612 A1 | 8/2014 | Bhasin et al. |
| 2014/0279762 A1 | 9/2014 | Xaypanya et al. |
| 2015/0149979 A1 | 5/2015 | Talby et al. |
| 2015/0163242 A1 | 6/2015 | Laidlaw et al. |
| 2015/0169294 A1 | 6/2015 | Brock et al. |
| 2015/0195192 A1 | 7/2015 | Vasseur et al. |
| 2015/0236935 A1 | 8/2015 | Bassett |
| 2015/0281225 A1 | 10/2015 | Schoen et al. |
| 2015/0317481 A1 | 11/2015 | Gardner et al. |
| 2015/0339263 A1 | 11/2015 | Ma et al. |
| 2015/0347414 A1 | 12/2015 | Xiao et al. |
| 2015/0379424 A1 | 12/2015 | Dirac et al. |
| 2016/0004858 A1 | 1/2016 | Chen et al. |
| 2016/0028758 A1 | 1/2016 | Ellis et al. |
| 2016/0072845 A1 | 3/2016 | Chiviendacz et al. |
| 2016/0078361 A1 | 3/2016 | Brueckner et al. |
| 2016/0099960 A1 | 4/2016 | Gerritz et al. |
| 2016/0105454 A1 | 4/2016 | Li et al. |
| 2016/0140519 A1 | 5/2016 | Trepca et al. |
| 2016/0275123 A1 | 9/2016 | Lin et al. |
| 2016/0285732 A1 | 9/2016 | Brech et al. |
| 2016/0342606 A1 | 11/2016 | Mouel et al. |
| 2016/0350442 A1 | 12/2016 | Crosby |
| 2016/0364307 A1 | 12/2016 | Garg et al. |
| 2017/0019678 A1 | 1/2017 | Kim et al. |
| 2017/0063896 A1 | 3/2017 | Muddu et al. |
| 2017/0083380 A1 | 3/2017 | Bishop et al. |
| 2017/0126712 A1 | 5/2017 | Crabtree et al. |
| 2017/0139763 A1 | 5/2017 | Ellwein |
| 2017/0149802 A1 | 5/2017 | Huang et al. |
| 2017/0193110 A1 | 7/2017 | Crabtree et al. |
| 2017/0322959 A1 | 11/2017 | Tidwell et al. |
| 2017/0323089 A1 | 11/2017 | Duggal et al. |
| 2018/0197128 A1 | 7/2018 | Carstens et al. |
| 2018/0300930 A1 | 10/2018 | Kennedy et al. |
| 2019/0082305 A1 | 3/2019 | Proctor |
| 2019/0095533 A1 | 3/2019 | Levine et al. |

SYSTEM AND METHODS FOR MULTI-LANGUAGE ABSTRACT MODEL CREATION FOR DIGITAL ENVIRONMENT SIMULATIONS

CROSS-REFERENCE TO RELATED APPLICATIONS

Priority is claimed in the application data sheet to the following patents or patent applications, the entire written description of each of which is expressly incorporated herein by reference in its entirety:
Ser. No. 15/835,312
Ser. No. 15/186,453
Ser. No. 15/166,158
Ser. No. 15/141,752
Ser. No. 15/091,563
Ser. No. 14/986,536
Ser. No. 14/925,974

BACKGROUND OF THE INVENTION

Field of the Art

The disclosure relates to the field of digital simulations, specifically the field of simulation environment model creation and execution.

Discussion of the State of the Art

For many years now, computer systems have been used to emulate various systems and environments for both analytical and academic purposes, as well as business and commercial purposes including for the use of highly advanced video games. Simulation of entire environments and of events and actors within the environment is a large area of computing with many advancements in the past years, and with many applications, including the ability to simulate events which occur in the natural world, for the purposes of analyzing them with greater specificity than we are sometimes able to achieve in reality. One can simulate a system or environment with time running many times faster than we would normally experience, for example to simulate the orbits of star systems, astronomical events, global events such as tidal wave propagation in Earth's oceans, and other phenomena for the purposes of research and development. Further, computer simulations of environments, behaviors, and complex systems is used for the creation of complex video game worlds, for both single player and massively multiplayer online games. However, technology and existing models for simulation of environments currently is highly specialized, and lacks the flexibility to model complex worlds with high degrees of accuracy and realism currently. Many systems for commercial use in game technology especially are rigid, specialized, and re-used systems, such as UNITY™ technologies. There also exists no way to combine simulation technologies to provide more complex or complete simulation models or environments.

What is needed is a system and methods for the creation and execution of abstract simulation models, which can be multi-language and multi-paradigm with respect to computer programming languages and simulation platforms, and create relationships between different simulation models. To solve the problem of inflexible and specialized simulation models and environments being unusable for other purposes and therefore requiring the creation of yet more specialized models for simulating different environments, such as in the case of physics engines for video games, meta-models may be used, to specify relationships not between objects and events in a model for simulation, but which may specify relationships and facilitate communication and transfer of data between simulation models, to allow extensible and highly complex simulations, using technologies including enhanced behavior trees (EBT's).

SUMMARY OF THE INVENTION

Accordingly, the inventor has conceived and reduced to practice, in a preferred embodiment of the invention, a system and methods for multi-language abstract digital simulation model generation and execution. The following non-limiting summary of the invention is provided for clarity, and should be construed consistently with embodiments described in the detailed description below.

To solve the problems of inflexible and limited-accuracy simulation systems, a system and methods have been devised for multi-language abstract digital simulation model generation and execution, comprising a meta-model structuring and creation system, meta-model mapping table, remote server, simulation execution process, computer domain specific language, and methods for user-creation and editing of meta-models, simulation models, and parametrization of simulation environments, actors, objects, and events in real-time using heuristic searching.

BRIEF DESCRIPTION OF THE DRAWING FIGURES

The accompanying drawings illustrate several aspects and, together with the description, serve to explain the principles of the invention according to the aspects. It will be appreciated by one skilled in the art that the particular arrangements illustrated in the drawings are merely exemplary, and are not to be considered as limiting of the scope of the invention or the claims herein in any way.

DETAILED DESCRIPTION

Figure 1:
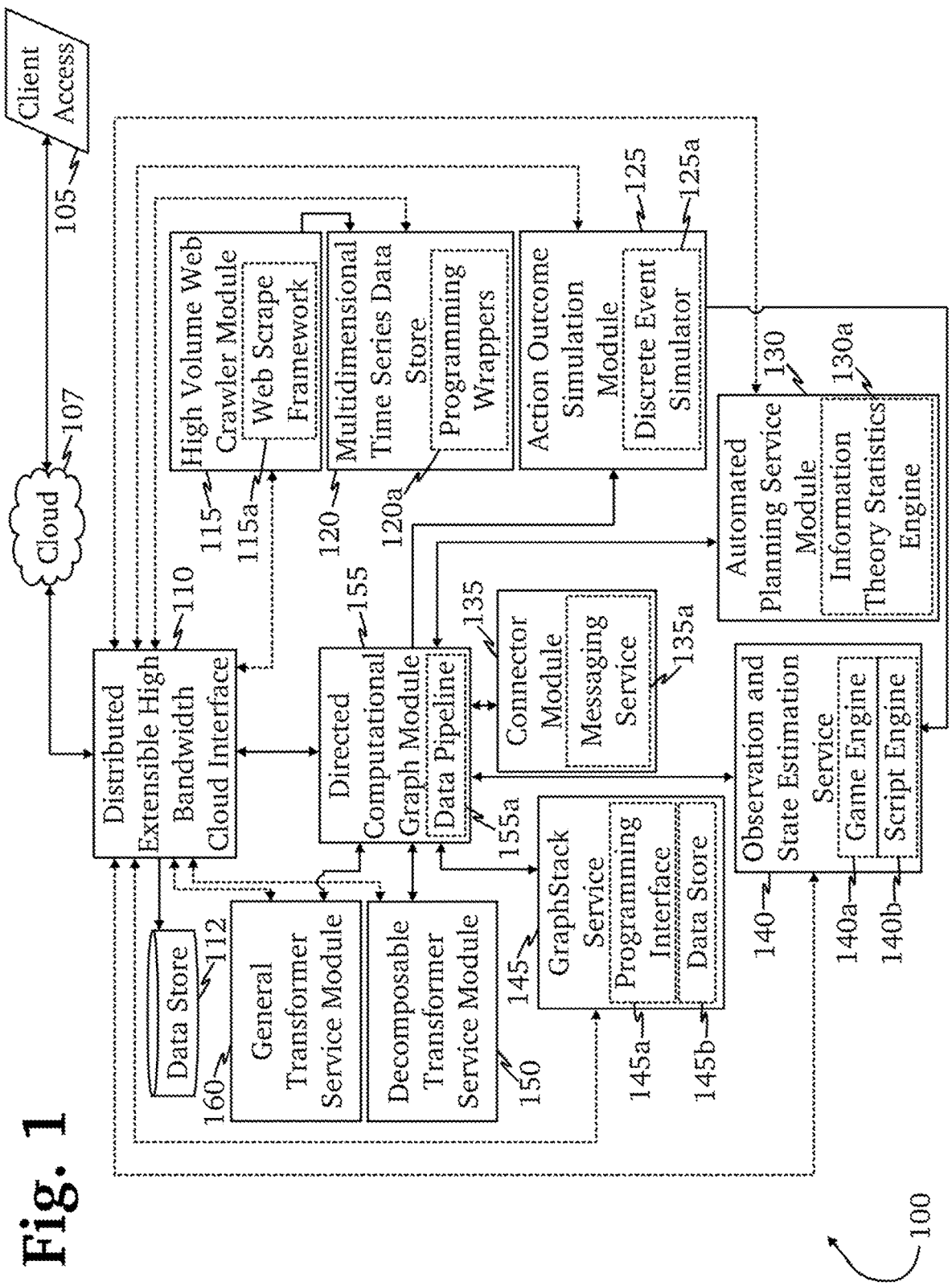
FIG. 1 is a diagram of an exemplary architecture of a business operating system according to a preferred aspect.

The inventor has conceived, and reduced to practice, a system and method for a system and method have been devised for multi-language abstract digital simulation model generation and execution.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article.

The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise. Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Definitions

As used herein, a meta-model, meta model or metamodel is a data structure representing relationships between simulation models and simulated environments using those models, as well as external or locally based computer tools which can be used for computational purposes. A meta-model is able to allow simulated environments which use a given meta-model to use specific models for simulation which normally possess strict limitations and functions, but use other simulation modeling engines such as different physics engines, without changing the content or function of any simulation model or the engine running it. For example a single meta-model might record a relationship between two physics engines, one being a generic physics engine with components such as rag-doll physics, jump speed for characters in a video game, bullet physics, and destructible environment physics, and the other physics engine being solely flight simulation. In such an example, the meta-model may specify that the flight simulation engine's physics may be applied to objects that, in the generic physics engine, are recorded as plane objects, thereby bypassing the need to alter either engine, and allowing both to work as-is, with each other, through the use of specified relationships in the meta-model.

Conceptual Architecture

FIG. 1 is a diagram of an exemplary architecture of a business operating system 100 according to an embodiment of the invention. Client access to the system 105 for specific data entry, system control and for interaction with system output such as automated predictive decision making and planning and alternate pathway simulations, occurs through the system's distributed, extensible high bandwidth cloud interface 110, connected to the wider cloud 107 through use of a network including Internet Protocol (IP) networks, which uses a versatile, robust web application driven interface for both input and display of client-facing information and a data store 112 such as, but not limited to MONGODB™, COUCHDB™, CASSANDRA™ or REDIS™ depending on the embodiment. Much of the business data analyzed by the system both from sources within the confines of the client business, and from cloud based sources, also enter the system through the cloud interface 110, data being passed to the connector module 135 which may possess the API routines 135a needed to accept and convert the external data and then pass the normalized information to other analysis and transformation components of the system, the directed computational graph module 155, high volume web crawler module 115, multidimensional time series database 120 with API's or other programming wrappers 120a and the graph stack service. The directed computational graph module 155 retrieves one or more streams of data from a plurality of sources, which includes, but is in no way not limited to, a plurality of physical sensors, web based questionnaires and surveys, monitoring of electronic infrastructure, crowd sourcing campaigns, and human input device information. Within the directed computational graph module 155, data may be split into two identical streams in a specialized pre-programmed data pipeline 155a, wherein one sub-stream may be sent for batch processing and storage while the other sub-stream may be reformatted for transformation pipeline analysis. The data is then transferred to the general transformer service module 160 for linear data transformation as part of analysis or the decomposable transformer service module 150 for branching or iterative transformations that are part of analysis. The directed computational graph module 155 represents all data as directed graphs where the transformations are nodes and the result messages between transformations edges of the graph. The high volume web crawling module 115 uses multiple server hosted preprogrammed web spiders, which while autonomously configured are deployed within a web scraping framework 115a of which SCRAPY™ is an example, to identify and retrieve data of interest from web based sources that are not well tagged by conventional web crawling technology. The multiple dimension time series database module 120 receives data from a large plurality of sensors that may be of several different types. The module is designed to accommodate irregular and high volume surges by dynamically allotting network bandwidth and server processing channels to process the incoming data. Inclusion of programming wrappers for languages examples of which are, but not limited to C++, PERL, PYTHON, and ERLANG™ allows sophisticated programming logic to be added to the default function of the multidimensional time series database 120 without intimate knowledge of the core programming as a wrapper or add-on 120a, greatly extending breadth of function. Data retrieved by the multidimensional time series database 120 and the high volume web crawling module 115 may be further analyzed and transformed into task optimized results by the directed computational graph 155 and associated general transformer service 150 and decomposable transformer service 160 modules. Alternately, data from the multidimensional time series database and high volume web crawling modules may be sent, often with scripted cuing information determining important vertexes 145a, to the graph stack service module 145 which, employing standardized protocols for converting streams of information into graph representations of that data, for example, open graph internet technology although the invention is not reliant on any one standard. Through the steps, the graph stack service module 145 represents data in graphical form influenced by any pre-determined scripted modifications 145a and stores it in a graph-based data store 145b such as GIRAPH™ or a key value pair type data store REDIS™, or RIAK™, among others, all of which are suitable for storing graph-based information.

Results of the transformative analysis process may then be combined with further client directives, additional business rules and practices relevant to the analysis and situational information external to the already available data in the automated planning service module 130 which also runs powerful information theory 130a based predictive statistics functions and machine learning algorithms to allow future trends and outcomes to be rapidly forecast based upon the current system derived results and choosing each of a plurality of possible business decisions. The using all available data, the automated planning service module 130 may propose business decisions most likely to result is the most favorable business outcome with a usably high level of certainty. Closely related to the automated planning service module in the use of system derived results in conjunction with possible externally supplied additional information in the assistance of end user business decision making, the action outcome simulation module 125 with its discrete event simulator programming module 125a coupled with the end user facing observation and state estimation service 140 which is highly scriptable 140b as circumstances require and has a game engine 140a to more realistically stage possible outcomes of business decisions under consideration, allows business decision makers to investigate the probable outcomes of choosing one pending course of action over another based upon analysis of the current available data. For example, the pipelines operations department has reported a very small reduction in crude oil pressure in a section of pipeline in a highly remote section of territory. Many believe the issue is entirely due to a fouled, possibly failing flow sensor, others believe that it is a proximal upstream pump that may have foreign material stuck in it. Correction of both of these possibilities is to increase the output of the effected pump to hopefully clean out it or the fouled sensor. A failing sensor will have to be replaced at the next maintenance cycle. A few, however, feel that the pressure drop is due to a break in the pipeline, probably small at this point, but even so, crude oil is leaking and the remedy for the fouled sensor or pump option could make the leak much worse and waste much time afterwards. The company does have a contractor about 8 hours away, or could rent satellite time to look but both of those are expensive for a probable sensor issue, significantly less than cleaning up an oil spill though and then with significant negative public exposure. These sensor issues have happened before and the business operating system 100 has data from them, which no one really studied due to the great volume of columnar figures, so the alternative courses 125, 140 of action are run. The system, based on all available data, predicts that the fouled sensor or pump is unlikely to be the root cause this time due to other available data, and the contractor is dispatched. She finds a small breach in the pipeline. There will be a small cleanup and the pipeline needs to be shut down for repair but multiple tens of millions of dollars have been saved. This is just one example of a great many of the possible use of the business operating system, those knowledgeable in the art will easily formulate more.

Figure 2:
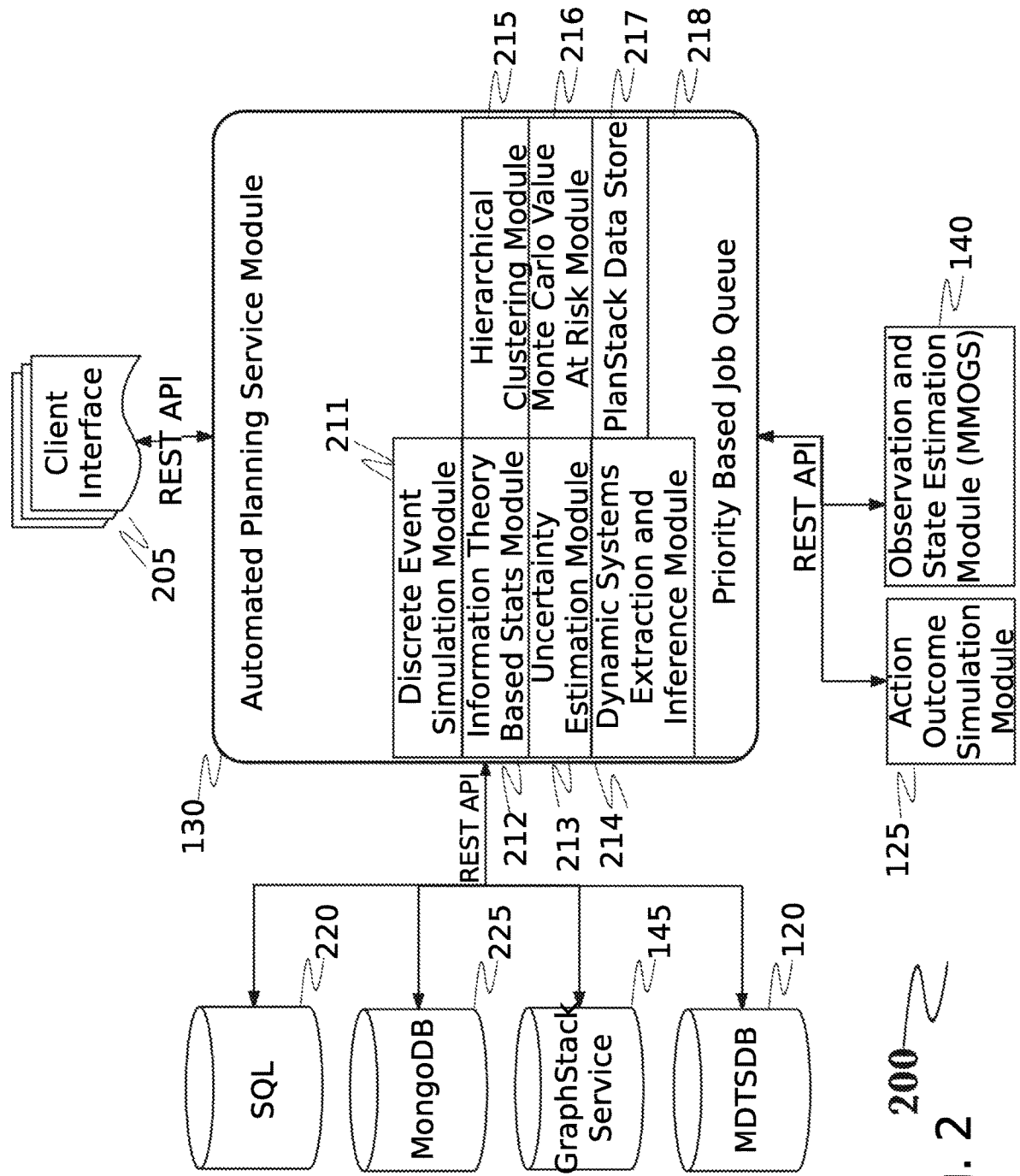
FIG. 2 is a diagram of an exemplary architecture of an automated planning service cluster and related modules according to a preferred aspect.

FIG. 2 is a diagram of an exemplary architecture of an automated planning service module and related modules 200 according to an embodiment of the invention. Seen here is a more detailed view of the automated planning service module 130 as depicted in FIG. 1. The module functions by receiving business decision or business venture candidates as well as relevant currently available related data and any campaign analysis modification commands through a client interface 205. The module may also be used provide transformed data or run parameters to the action outcome simulation module 125 to seed a simulation prior to run or to transform intermediate result data isolated from one or more actors operating in the action outcome simulation module 125, during a simulation run. Significant amounts of supporting information such as, but not restricted to current business conditions, infrastructure, ongoing venture status, financial status, market conditions, and world events which may impact the current decision or venture that have been collected by the business operating system as a whole and stored in such data stores as the multidimensional times series database 120, the analysis capabilities of the directed computational graph module 155 and web-based data retrieval abilities of the high volume web crawler module 115 all of which may be stored in one or more data stores 220, 225 may also be used during simulation of alternative business decision progression, which may entail such variables as, but are not limited to implementation timing, method to end changes, order and timing of constituent part completion or impact of choosing another goal instead of an action currently under analysis.

Contemplated actions may be broken up into a plurality of constituent events that either act towards the fulfillment of the venture under analysis or represent the absence of each event by the discrete event simulation module 211 which then makes each of those events available for information theory based statistical analysis 212, which allows the current decision events to be analyzed in light of similar events under conditions of varying dis-similarity using machine learned criteria obtained from that previous data; results of this analysis in addition to other factors may be analyzed by an uncertainty estimation module 213 to further tune the level of confidence to be included with the finished analysis. Confidence level would be a weighted calculation of the random variable distribution given to each event analyzed. Prediction of the effects of at least a portion of the events involved with a business venture under analysis within a system as complex as anything from the microenvironment in which the client business operates to more expansive arenas as the regional economy or further, from the perspective of success of the client business is calculated in dynamic systems extraction and inference module 214, which use, among other tools algorithms based upon Shannon entropy, Hartley entropy and mutual information dependence theory.

Of great importance in any business decision or new business venture is the amount of business value that is being placed at risk by choosing one decision over another. Often this value is monetary but it can also be competitive placement, operational efficiency or customer relationship based, for example: the may be the effects of keeping an older, possibly somewhat malfunctioning customer relationship management system one more quarter instead of replacing it for $14 million dollars and a subscription fee. The automated planning service module has the ability predict the outcome of such decisions per value that will be placed at risk using programming based upon the Monte Carlo heuristic model 216 which allows a single state estimation of value at risk. It is very difficult to anticipate the amount of computing power that will be needed to complete one or more of these business decision analyses which can vary greatly in individual needs and often are run with several alternatives concurrently. The invention is therefore designed to run on expandable clusters 215, in a distributed, modular, and extensible approach, such as, but not exclusively, offerings of Amazon's AWS. Similarly, these analysis jobs may run for many hours to completion and many clients may be anticipating long waits for simple what if options which will not affect their business operations in the near term while other clients may have come upon a pressing decision situation where they need alternatives as soon as possible. This is accommodated by the presence of a job queue that allows analysis jobs to be implemented at one of multiple priority levels from low to urgent. In case of a change in more hypothetical analysis jobs to more pressing, job priorities can also be changed during run without loss of progress using the priority based job queue 218.

Structured plan analysis result data may be stored in either a general purpose automated planning engine executing Action Notation Modeling Language (ANML) scripts for modeling which can be used to prioritize both human and machine-oriented tasks to maximize reward functions over finite time horizons 217 or through the graph-based data store 145, depending on the specifics of the analysis in complexity and time run.

The results of analyses may be sent to one of two client facing presentation modules, the action outcome simulation module 125 or the more visual simulation capable observation and state estimation module 140 depending on the needs and intended usage of the data by the client.

Figure 3:
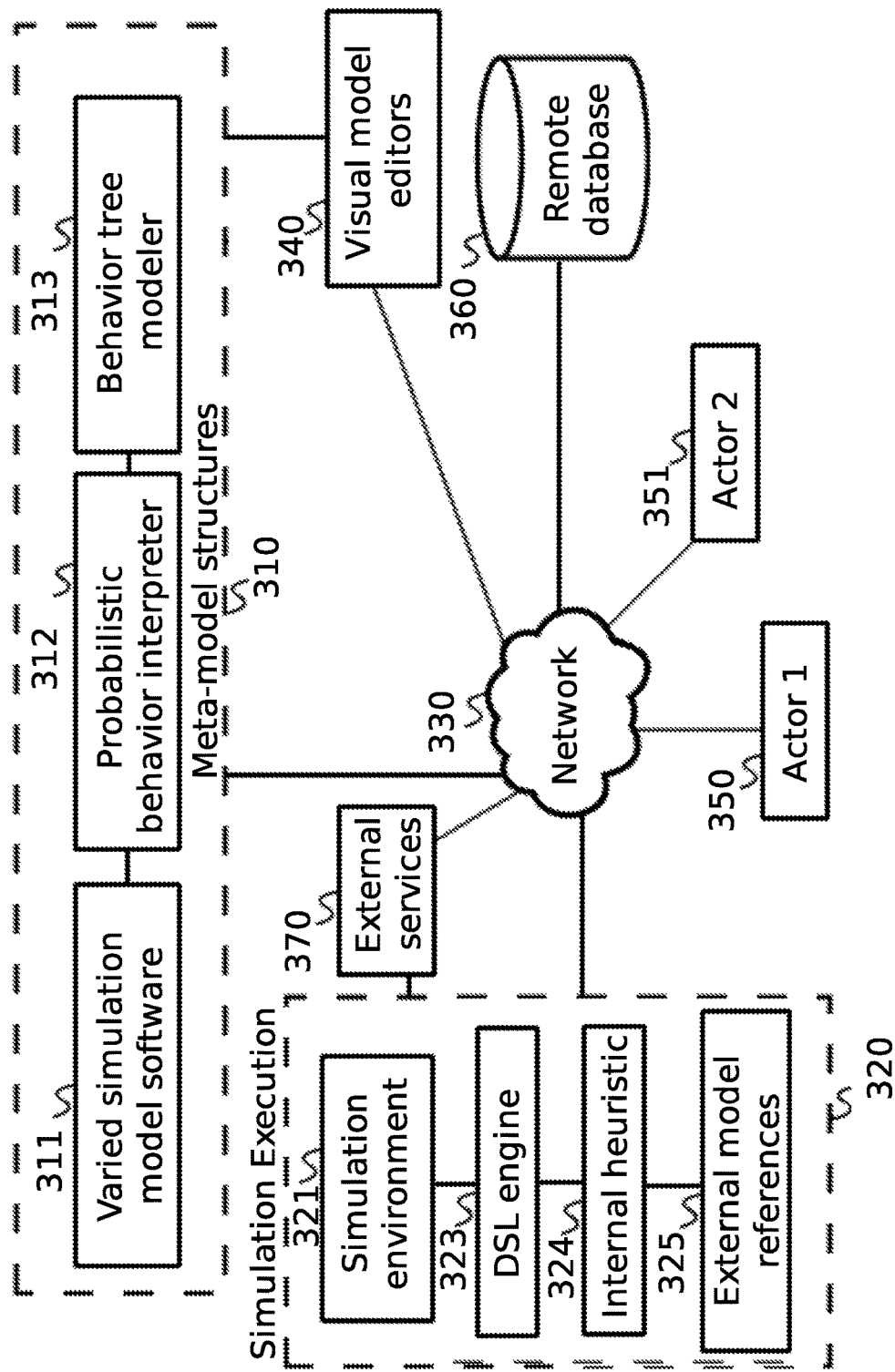
FIG. 3 is a diagram of an exemplary architecture of meta-model structure, simulation engine execution with actors, and a visual meta-model editor, according to a preferred aspect.

FIG. 3 is a block diagram illustrating an exemplary architecture for a meta-model and simulation execution system. In the system, a meta-model 310 first is constructed, using either a pre-made meta-model stored on a database 360 accessible over a network 330, or by creating a new meta-model 310 through the use of a visual editor 340. It is also possible to edit an already-created meta-model 310 for fine-tuning or modifications desired for a specific user, with a visual editor 340, either through a web-browser or as a stand-alone application, over a network 330. A meta-model 310 possesses core components including a variety of possible simulation models 311, which can be many different simulation models used to form an environment, including the UNITY™ game development engine, services such as those used in powerflow simulation engine, and others which may be used to model specific parts of a complete environment as specified by a meta-model's 310 relationship mapping. Relationships between simulation agents and environments 311 within a meta-model are specified in a mapping table 410 in FIG. 4. Simulation models 311 may also be built specifically for the meta-model using the visual editor 340. The behavior for these simulation models 311 or services will be recorded in a probabilistic behavior tree 313, which may or may not be reduced to a finite state automaton for certain implementations. In order to record the behavior in a behavior tree 313, the simulation models 311 are evaluated by a probabilistic behavior interpreter 312, which may map specific behaviors and outcomes of certain simulation agent behaviors and environment interactions 311 to a tree of behaviors and outputs 313. Meta-models 310 created by a user, or edited by a user and saved as new meta-models 310 for mapping simulation model relationships, are saved over a network 330 to a remote database 360. Simulation execution 320, which may occur in such situations as a video game going online, first establishes a simulation environment 321, which may be any given simulation model 311 and communicating with other models and environments according to the meta-model 310. External services 370 may be used to provide extended functionality, such as emulating a powerflow system, or emulating hardware with specialized software, accessed by the simulation environment's 321 specifications. These services may be accessed either on the computer running the simulated environment 321, or accessed remotely through a network 330. The system execution 320 runs a Domain Specific Language (DSL) engine 323 which will interpret an extensible, multi-paradigm language, extending the Erlang programming language. The DSL is built as data structures in Erlang, and includes methods of parsing and execution of data structures, supports concepts from functional, dataflow, probabilistic, and rule-based programming paradigms. Data structures in the DSL which form the code run by the DSL engine 323 are to be interpreted as behavior trees 313, with specialized nodes and action-callbacks which serve as extensions of behavior tree logic. An internal heuristic 324 allows designers of simulation models 311 to alter the simulation environment 321 by searching an environment for specific events, objects, or actors within a simulated environment 321 and parametrize them as desired, altering their status within the environment 321 and potentially changing their recorded behaviors in the behavior trees 313 or adding new behaviors altogether. This can be done prior to or during simulation execution. External model references 325 are relationships between different simulation models 311, which are specified in more detail in FIG. 4. Actors 350, 351 may be of an indefinite number, and represent users of the simulation itself, including people who may use a simulation 320 for training purposes, or players of a video game which runs the simulation system 320 to facilitate gameplay.

Figure 4:
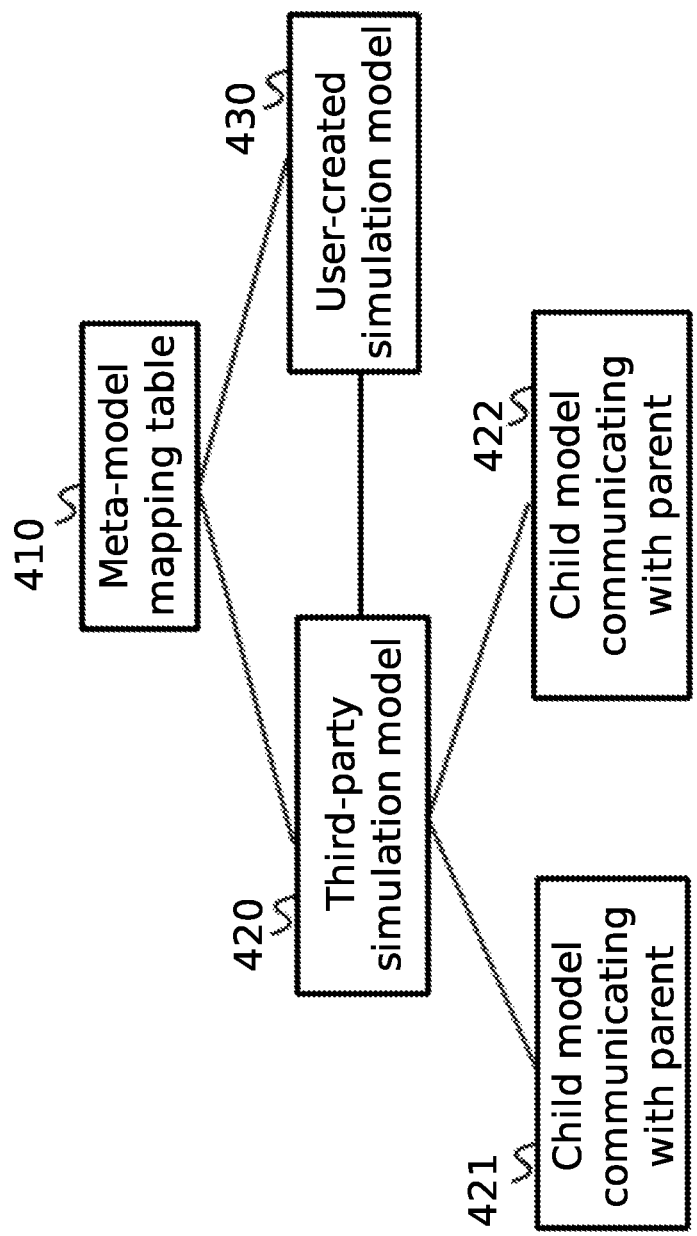
FIG. 4 is a diagram of an exemplary architecture of a meta-model's relationships between simulation models mapped by a meta-model's mapping table, according to a preferred aspect.

FIG. 4 is a block diagram illustrating the construction of the mapping table of a meta-model 410. Each meta-model 310 possesses a mapping table 410 which records relationships between simulation models and tools, which may include a third-party simulation model 420 such as a generic physics engine, such as UNITY 3D™ or HAVOK™. User-created models 430 may also be used, either by uploading to the system the model, or by creating or editing a model with a visual model editor 340. Any such models in a meta-model may be mapped with at least one child model 421, 422, which may, for example, be a flight simulation physics engine, which may be used to add functionality with a more general physics engine, but may be other forms of simulation models as well, according to an aspect.

Figure 5:
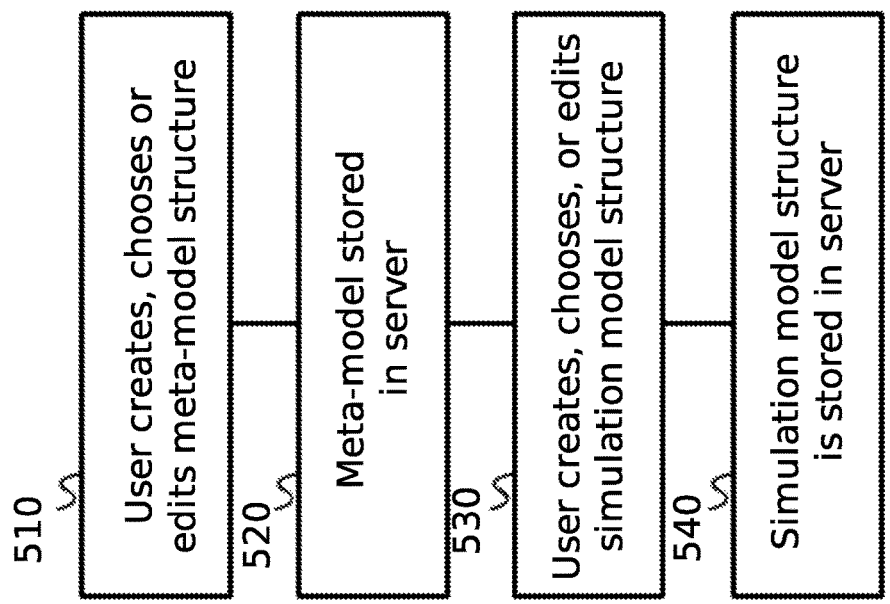
FIG. 5 is a method diagram illustrating a user of the system creating simulation meta-models and models to be stored in a remote server, according to a preferred aspect.

FIG. 5 is a block diagram illustrating steps taken by a user of the system creating simulation meta-models 310 and models 311 to be stored in a remote server 360, according to a preferred aspect. A user may create or choose and edit a pre-existing meta-model 510, using a visual model editor 340. This allows a user to either use a pre-existing meta-model they have, edit the model, or create an entirely new meta-model. In these instances the meta-model is stored on a remote server 360 after the user is finished 520. A user may instead, or in addition, create or choose and edit a pre-existing simulation model 530, using a visual model editor 340. This allows a user to either use a pre-existing environment model they have, edit the model, or create an entirely new environment model. In these instances the model is stored on a remote server 360 after the user is finished 540.

Figure 6:
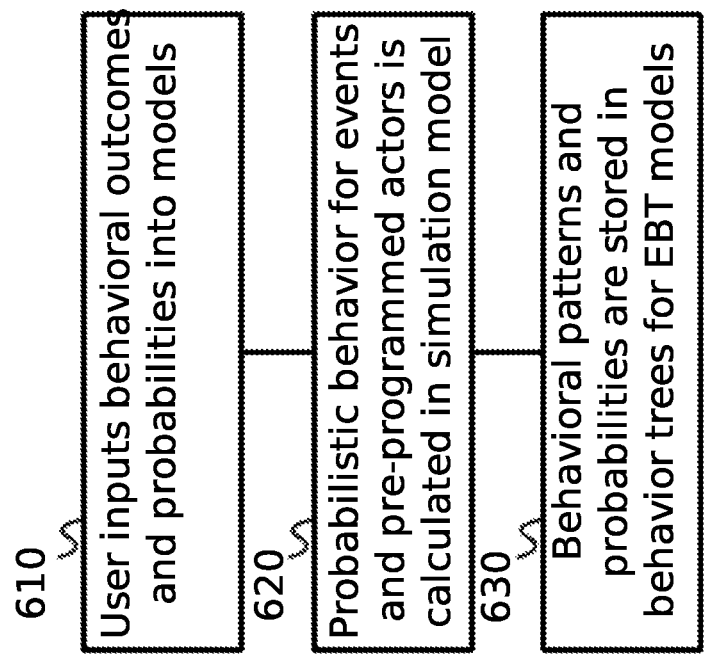
FIG. 6 is a method diagram illustrating a user entering desired behaviors for a designed simulation, according to a preferred aspect.

FIG. 6 is a block diagram illustrating a user entering desired behaviors for a designed simulation, according to a preferred aspect. A user may input, or program, using the DSL engine 323, DSL data structures for how an entity in a model may act probabilistically 610. A user may also use a visual model editor 340 to create behaviors for entities and events in the model. The probabilistic behavior for events and actors in the simulation are then calculated 620, and stored in behavior trees 630.

Figure 7:
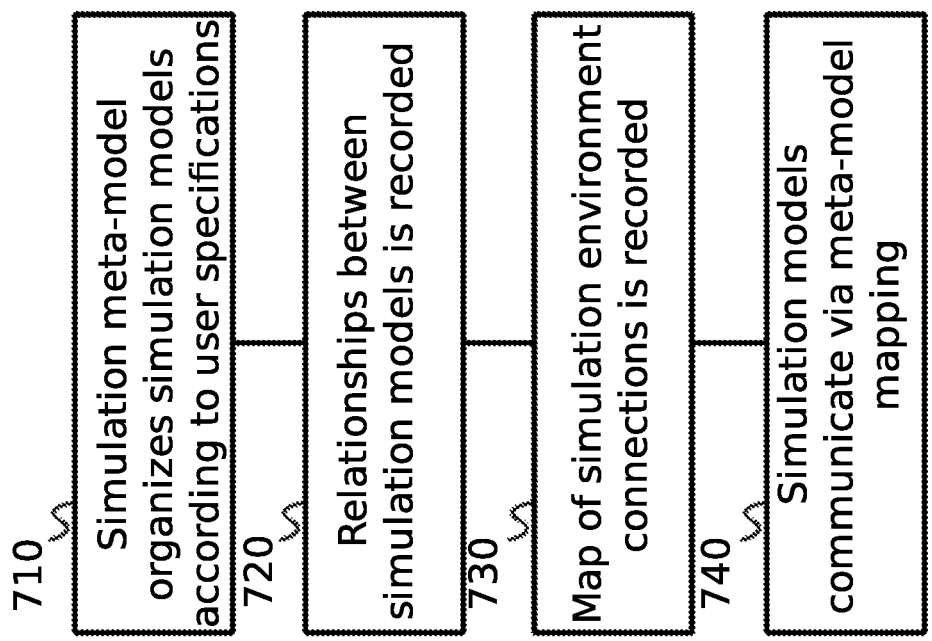
FIG. 7 is a method diagram illustrating the process of a meta-model mapping simulation model relationships, according to a preferred aspect.

FIG. 7 is a block diagram illustrating the process of a meta-model 310 mapping simulation model relationships, according to a preferred aspect. A meta-model will make a mapping list 410 of relationships, organizing simulation models according to user specifications 710 after being edited or created in a visual editor 340. This mapping table 410 is recorded internally to the meta-model, which is itself stored on a database 360, 720. Similarly, simulation models used in an environment may or may not be aware of connections to other simulation models as being such, but are able to communicate with them through their own constructs thanks to the meta-model, and such relationships are recorded in the models themselves 730. Models may make use of these connections for more varied and expansive capabilities in a simulated environment 740. For example, a model which accurately models basic Newtonian physics for the purposes of a game, may not be programmed to be connected to other tools and modeling environments, but through the system may make use of a physics engine for flight, from a flight simulator, when a player in the game enters a certain object 740. Such relationships serve to extend the abilities of, and improve the realism of, simulations in general.

Figure 8:
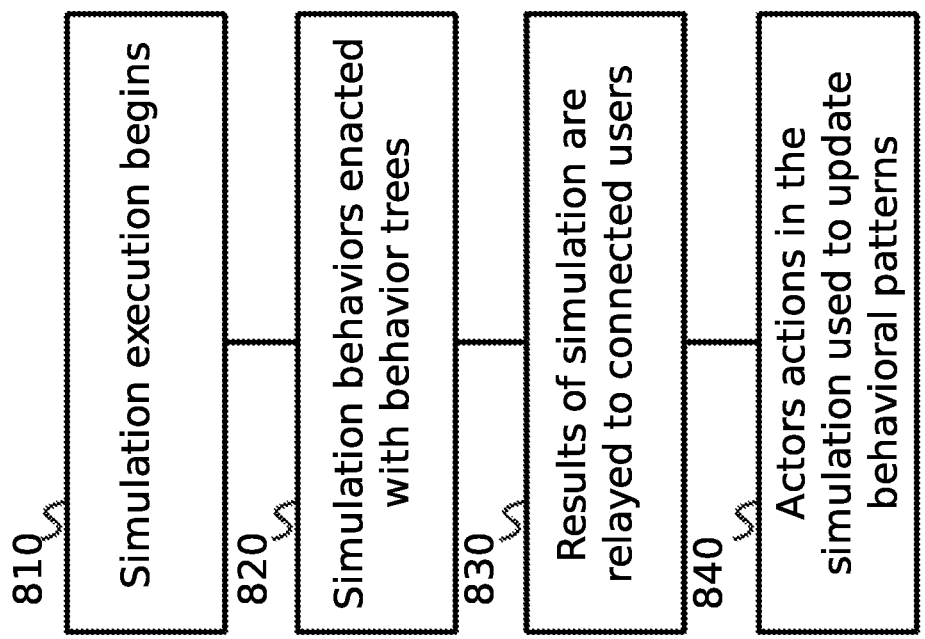
FIG. 8 is a method diagram illustrating the execution of a simulation and users interacting with the simulated environment, according to a preferred aspect.

FIG. 8 is a block diagram illustrating the execution of a simulation and users interacting with the simulated environment, according to a preferred aspect. The simulation begins execution 810, 320. This is a necessary first step. The simulation then enacts behaviors from the recorded behavior trees 820, 313 which dictate a probabilistic behavior for many objects and events in a simulation environment. Results of these actions are relayed through a network 330 to any users that may be connected to the simulation 830, but users need not be connected to a simulated environment for that environment to progress, with events and objects behaving as they are programmed, without users or actors at a given point. If a user (or actor) is connected to a simulation being executed 320, the actions of the user in the simulation 320 are relayed through a network 330 and influence the simulation, and the simulation's behaviors may be altered to reflect third-party actions and changes in the environment 840. For example, in a video game, a user may destroy a building, which may in turn affect whether an enemy in the video game's simulation would try to hide behind the building, since it is no longer there.

Figure 9:
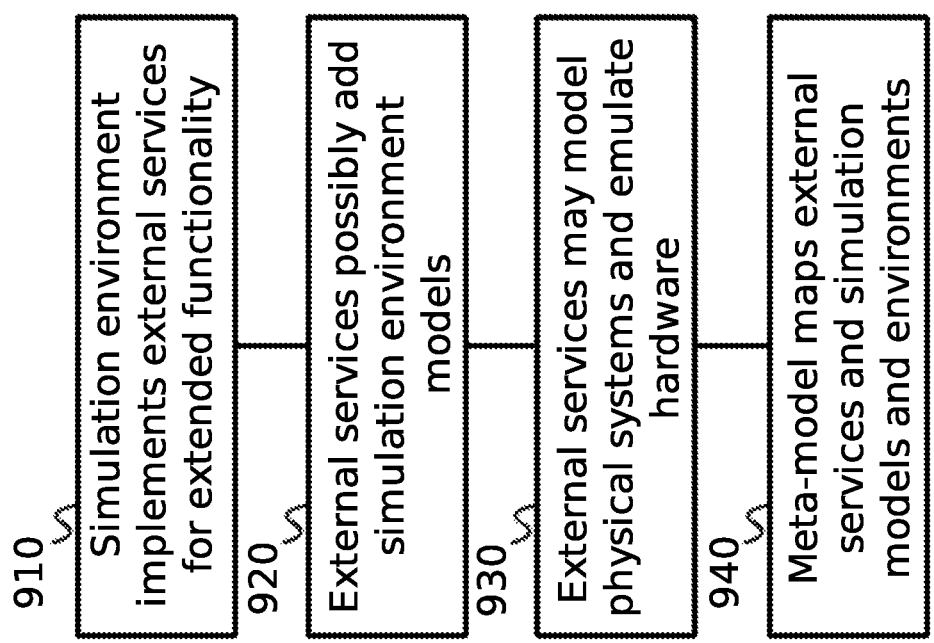
FIG. 9 is a method diagram illustrating key steps in the use of external services to construct a simulated environment, according to a preferred aspect.

FIG. 9 is a block diagram illustrating key steps in the use of external services to construct a simulated environment, according to a preferred aspect. Simulation environments 321, or individual simulation models 311 used to create an environment, may make use of external services, tools, or applications for extended functionality 910. Such tools and services may be diverse and varied in nature, including tools hosted on AMAZON WEB SERVICES™, WINDOWS AZURE™, and other hosting platforms, or tools installed locally on the server or computer hosting the simulated environment. External tools and services may reference, depending on their capabilities, other simulation models 920, thereby allowing the creation of tools and services built around the invention, for future extensibility. External tools or services may also provide the ability to emulate hardware within simulations 930. Simulations of hardware systems are possible and used for purposes such as circuit design, power grid management, and more, and may be used in simulations or meta-models for extended functionality or emulation of specialized hardware 930, 940. Meta-models may map out relationships between simulation models 311 and external tools 370 in some cases 940, similar to how simulation models are mapped out in relation to each other in FIG. 4.

Hardware Architecture

Generally, the techniques disclosed herein may be implemented on hardware or a combination of software and hardware. For example, they may be implemented in an operating system kernel, in a separate user process, in a library package bound into network applications, on a specially constructed machine, on an application-specific integrated circuit (ASIC), or on a network interface card.

Software/hardware hybrid implementations of at least some of the aspects disclosed herein may be implemented on a programmable network-resident machine (which should be understood to include intermittently connected network-aware machines) selectively activated or reconfigured by a computer program stored in memory. Such network devices may have multiple network interfaces that may be configured or designed to utilize different types of network communication protocols. A general architecture for some of these machines may be described herein in order to illustrate one or more exemplary means by which a given unit of functionality may be implemented. According to specific aspects, at least some of the features or functionalities of the various aspects disclosed herein may be implemented on one or more general-purpose computers associated with one or more networks, such as for example an end-user computer system, a client computer, a network server or other server system, a mobile computing device (e.g., tablet computing device, mobile phone, smartphone, laptop, or other appropriate computing device), a consumer electronic device, a music player, or any other suitable electronic device, router, switch, or other suitable device, or any combination thereof. In at least some aspects, at least some of the features or functionalities of the various aspects disclosed herein may be implemented in one or more virtualized computing environments (e.g., network computing clouds, virtual machines hosted on one or more physical computing machines, or other appropriate virtual environments).

Figure 10:
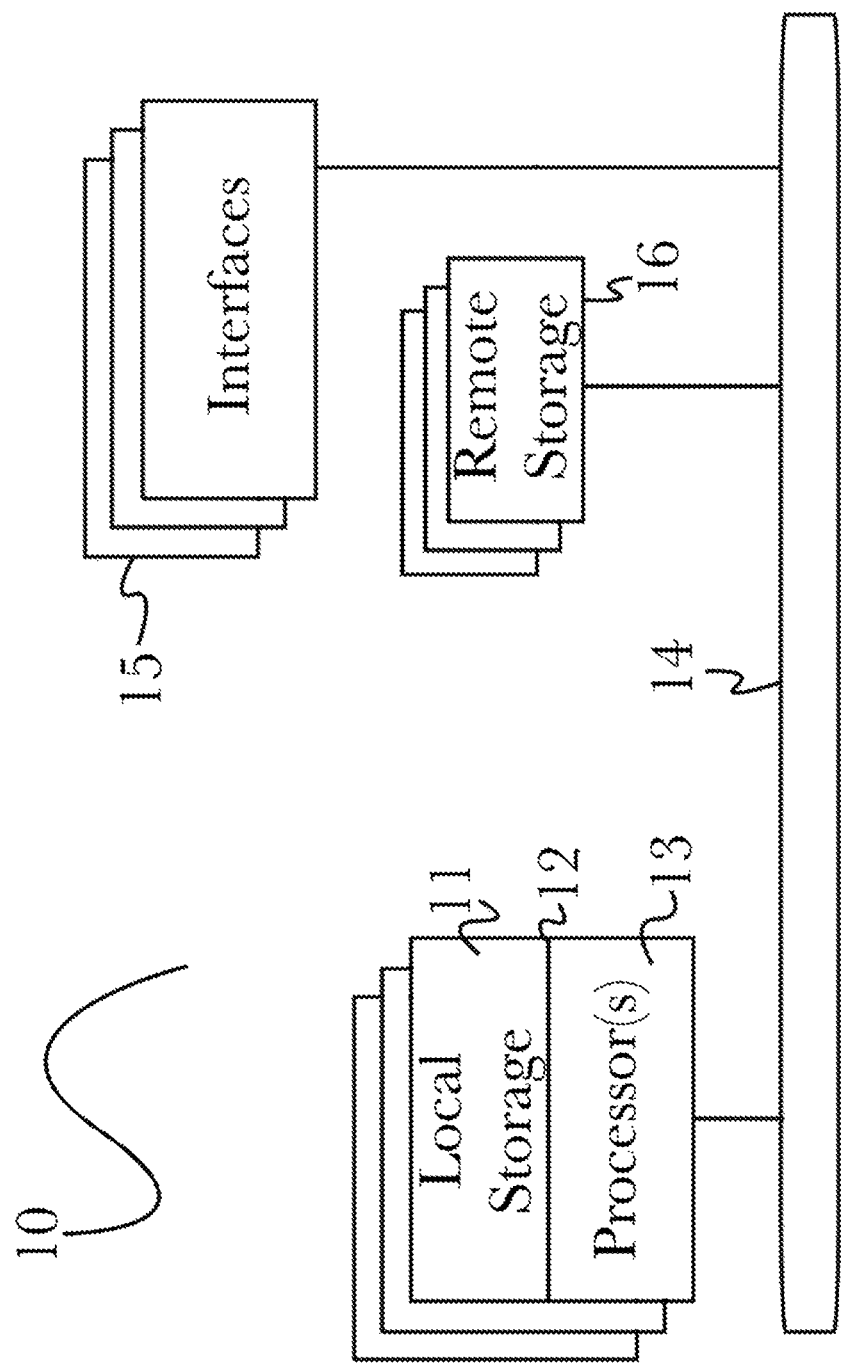
FIG. 10 is a block diagram illustrating an exemplary hardware architecture of a computing device.

Referring now to FIG. 10, there is shown a block diagram depicting an exemplary computing device 10 suitable for implementing at least a portion of the features or functionalities disclosed herein. Computing device 10 may be, for example, any one of the computing machines listed in the previous paragraph, or indeed any other electronic device capable of executing software- or hardware-based instructions according to one or more programs stored in memory. Computing device 10 may be configured to communicate with a plurality of other computing devices, such as clients or servers, over communications networks such as a wide area network a metropolitan area network, a local area network, a wireless network, the Internet, or any other network, using known protocols for such communication, whether wireless or wired.

In one embodiment, computing device 10 includes one or more central processing units (CPU) 12, one or more interfaces 15, and one or more busses 14 (such as a peripheral component interconnect (PCI) bus). When acting under the control of appropriate software or firmware, CPU 12 may be responsible for implementing specific functions associated with the functions of a specifically configured computing device or machine. For example, in at least one embodiment, a computing device 10 may be configured or designed to function as a server system utilizing CPU 12, local memory 11 and/or remote memory 16, and interface(s) 15. In at least one embodiment, CPU 12 may be caused to perform one or more of the different types of functions and/or operations under the control of software modules or components, which for example, may include an operating system and any appropriate applications software, drivers, and the like.

CPU 12 may include one or more processors 13 such as, for example, a processor from one of the Intel, ARM, Qualcomm, and AMD families of microprocessors. In some embodiments, processors 13 may include specially designed hardware such as application-specific integrated circuits (ASICs), electrically erasable programmable read-only memories (EEPROMs), field-programmable gate arrays (FPGAs), and so forth, for controlling operations of computing device 10. In a specific embodiment, a local memory 11 (such as non-volatile random access memory (RAM) and/or read-only memory (ROM), including for example one or more levels of cached memory) may also form part of CPU 12. However, there are many different ways in which memory may be coupled to system 10. Memory 11 may be used for a variety of purposes such as, for example, caching and/or storing data, programming instructions, and the like. It should be further appreciated that CPU 12 may be one of a variety of system-on-a-chip (SOC) type hardware that may include additional hardware such as memory or graphics processing chips, such as a QUALCOMM SNAPDRAGON™ or SAMSUNG EXYNOS™ CPU as are becoming increasingly common in the art, such as for use in mobile devices or integrated devices.

As used herein, the term processor is not limited merely to those integrated circuits referred to in the art as a processor, a mobile processor, or a microprocessor, but broadly refers to a microcontroller, a microcomputer, a programmable logic controller, an application-specific integrated circuit, and any other programmable circuit.

In one embodiment, interfaces 15 are provided as network interface cards (NICs). Generally, NICs control the sending and receiving of data packets over a computer network; other types of interfaces 15 may for example support other peripherals used with computing device 10. Among the interfaces that may be provided are Ethernet interfaces, frame relay interfaces, cable interfaces, DSL interfaces, token ring interfaces, graphics interfaces, and the like. In addition, various types of interfaces may be provided such as, for example, universal serial bus (USB), Serial, Ethernet, FIREWIRE™, THUNDERBOLT™, PCI, parallel, radio frequency (RF), BLUETOOTH™, near-field communications (e.g., using near-field magnetics), 802.11 (Wi-Fi), frame relay, TCP/IP, ISDN, fast Ethernet interfaces, Gigabit Ethernet interfaces, Serial ATA (SATA) or external SATA (ESATA) interfaces, high-definition multimedia interface (HDMI), digital visual interface (DVI), analog or digital audio interfaces, asynchronous transfer mode (ATM) interfaces, high-speed serial interface (HSSI) interfaces, Point of Sale (POS) interfaces, fiber data distributed interfaces (FDDIs), and the like. Generally, such interfaces 15 may include physical ports appropriate for communication with appropriate media. In some cases, they may also include an independent processor (such as a dedicated audio or video processor, as is common in the art for high-fidelity A/V hardware interfaces) and, in some instances, volatile and/or non-volatile memory (e.g., RAM).

Although the system shown in FIG. 10 illustrates one specific architecture for a computing device 10 for implementing one or more of the inventions described herein, it is by no means the only device architecture on which at least a portion of the features and techniques described herein may be implemented. For example, architectures having one or any number of processors 13 may be used, and such processors 13 may be present in a single device or distributed among any number of devices. In one embodiment, a single processor 13 handles communications as well as routing computations, while in other embodiments a separate dedicated communications processor may be provided. In various embodiments, different types of features or functionalities may be implemented in a system according to the invention that includes a client device (such as a tablet device or smartphone running client software) and server systems (such as a server system described in more detail below).

Regardless of network device configuration, the system of the present invention may employ one or more memories or memory modules (such as, for example, remote memory block 16 and local memory 11) configured to store data, program instructions for the general-purpose network operations, or other information relating to the functionality of the embodiments described herein (or any combinations of the above). Program instructions may control execution of or comprise an operating system and/or one or more applications, for example. Memory 16 or memories 11, 16 may also be configured to store data structures, configuration data, encryption data, historical system operations information, or any other specific or generic non-program information described herein.

Because such information and program instructions may be employed to implement one or more systems or methods described herein, at least some network device embodiments may include nontransitory machine-readable storage media, which, for example, may be configured or designed to store program instructions, state information, and the like for performing various operations described herein. Examples of such nontransitory machine-readable storage media include, but are not limited to, magnetic media such as hard disks, floppy disks, and magnetic tape; optical media such as CD-ROM disks; magneto-optical media such as optical disks, and hardware devices that are specially configured to store and perform program instructions, such as read-only memory devices (ROM), flash memory (as is common in mobile devices and integrated systems), solid state drives (SSD) and hybrid SSD storage drives that may combine physical components of solid state and hard disk drives in a single hardware device (as are becoming increasingly common in the art with regard to personal computers), memristor memory, random access memory (RAM), and the like. It should be appreciated that such storage means may be integral and non-removable (such as RAM hardware modules that may be soldered onto a motherboard or otherwise integrated into an electronic device), or they may be removable such as swappable flash memory modules (such as thumb drives or other removable media designed for rapidly exchanging physical storage devices), hot-swappable hard disk drives or solid state drives, removable optical storage discs, or other such removable media, and that such integral and removable storage media may be utilized interchangeably. Examples of program instructions include both object code, such as may be produced by a compiler, machine code, such as may be produced by an assembler or a linker, byte code, such as may be generated by for example a JAVA™ compiler and may be executed using a Java virtual machine or equivalent, or files containing higher level code that may be executed by the computer using an interpreter (for example, scripts written in Python, Perl, Ruby, Groovy, or any other scripting language).

Figure 11:
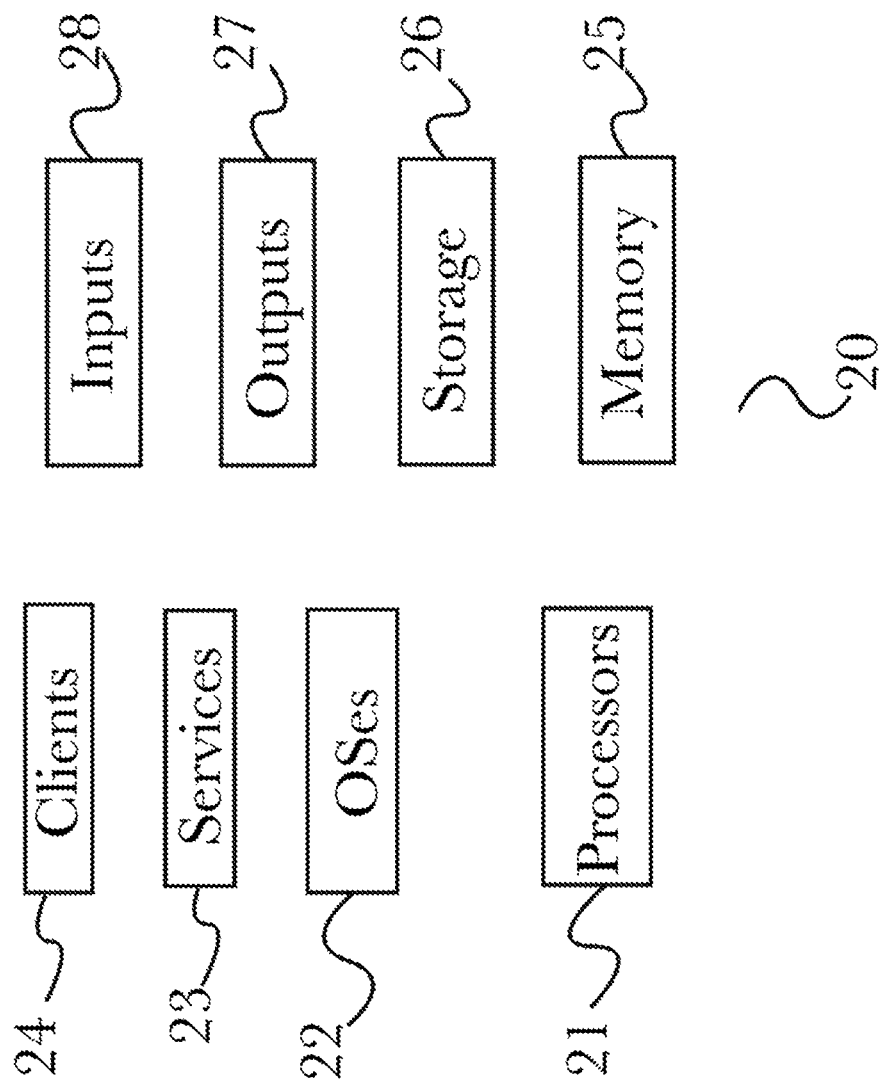
FIG. 11 is a block diagram illustrating an exemplary logical architecture for a client device.

In some embodiments, systems according to the present invention may be implemented on a standalone computing system. Referring now to FIG. 11, there is shown a block diagram depicting a typical exemplary architecture of one or more embodiments or components thereof on a standalone computing system. Computing device 20 includes processors 21 that may run software that carry out one or more functions or applications of embodiments of the invention, such as for example a client application 24. Processors 21 may carry out computing instructions under control of an operating system 22 such as, for example, a version of MICROSOFT WINDOWS™ operating system, APPLE OSX™ or iOS™ operating systems, some variety of the Linux operating system, ANDROID™ operating system, or the like. In many cases, one or more shared services 23 may be operable in system 20, and may be useful for providing common services to client applications 24. Services 23 may for example be WINDOWS™ services, user-space common services in a Linux environment, or any other type of common service architecture used with operating system 21. Input devices 28 may be of any type suitable for receiving user input, including for example a keyboard, touchscreen, microphone (for example, for voice input), mouse, touchpad, trackball, or any combination thereof. Output devices 27 may be of any type suitable for providing output to one or more users, whether remote or local to system 20, and may include for example one or more screens for visual output, speakers, printers, or any combination thereof. Memory 25 may be random-access memory having any structure and architecture known in the art, for use by processors 21, for example to run software. Storage devices 26 may be any magnetic, optical, mechanical, memristor, or electrical storage device for storage of data in digital form (such as those described above, referring to FIG. 10). Examples of storage devices 26 include flash memory, magnetic hard drive, CD-ROM, and/or the like.

Figure 12:
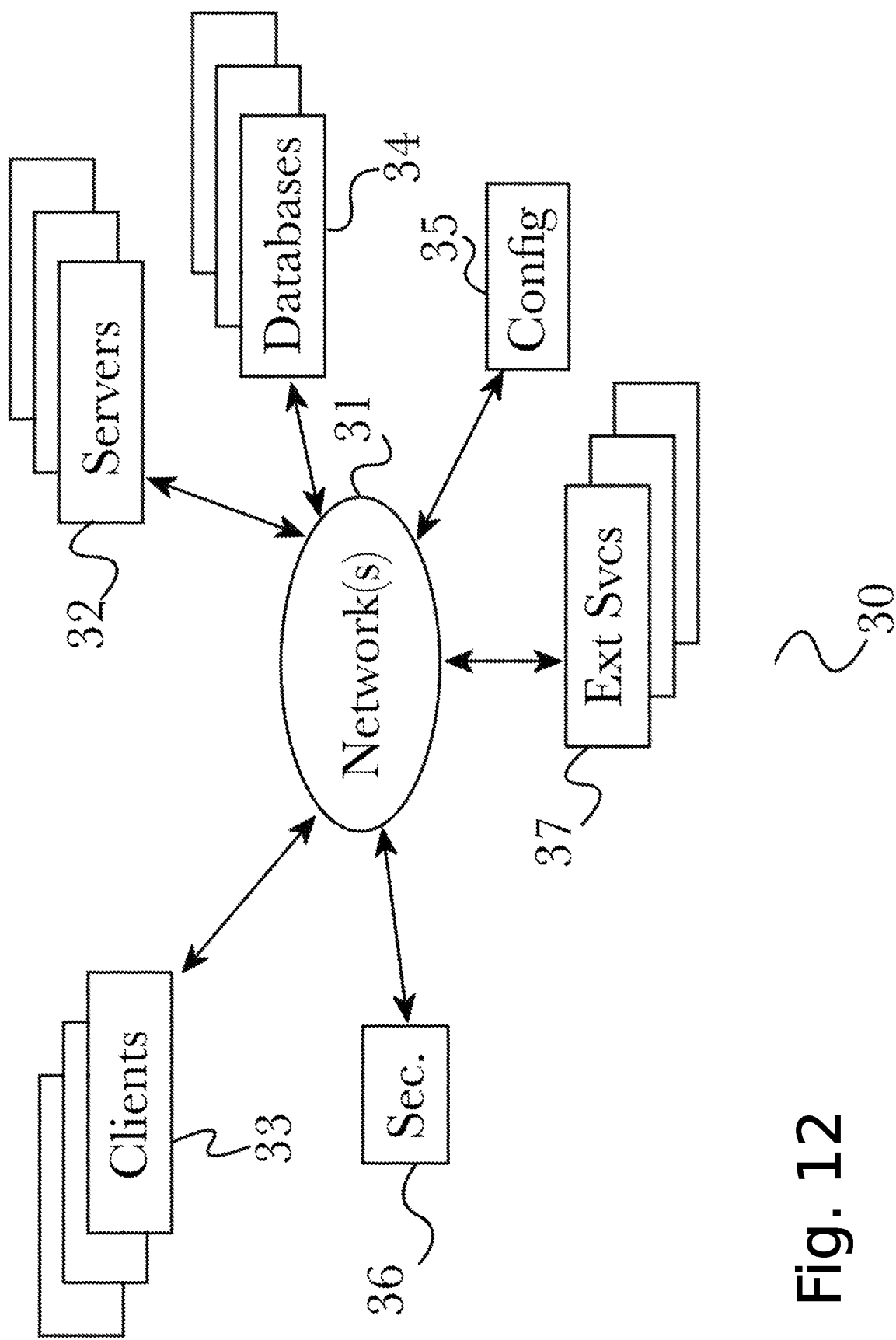
FIG. 12 is a block diagram showing an exemplary architectural arrangement of clients, servers, and external services.

In some embodiments, systems of the present invention may be implemented on a distributed computing network, such as one having any number of clients and/or servers. Referring now to FIG. 12, there is shown a block diagram depicting an exemplary architecture 30 for implementing at least a portion of a system according to an embodiment of the invention on a distributed computing network. According to the embodiment, any number of clients 33 may be provided. Each client 33 may run software for implementing client-side portions of the present invention; clients may comprise a system 20 such as that illustrated in FIG. 11. In addition, any number of servers 32 may be provided for handling requests received from one or more clients 33. Clients 33 and servers 32 may communicate with one another via one or more electronic networks 31, which may be in various embodiments any of the Internet, a wide area network, a mobile telephony network (such as CDMA or GSM cellular networks), a wireless network (such as WiFi, WiMAX, LTE, and so forth), or a local area network (or indeed any network topology known in the art; the invention does not prefer any one network topology over any other). Networks 31 may be implemented using any known network protocols, including for example wired and/or wireless protocols.

In addition, in some embodiments, servers 32 may call external services 37 when needed to obtain additional information, or to refer to additional data concerning a particular call. Communications with external services 37 may take place, for example, via one or more networks 31. In various embodiments, external services 37 may comprise web-enabled services or functionality related to or installed on the hardware device itself. For example, in an embodiment where client applications 24 are implemented on a smartphone or other electronic device, client applications 24 may obtain information stored in a server system 32 in the cloud or on an external service 37 deployed on one or more of a particular enterprise's or user's premises.

In some embodiments of the invention, clients 33 or servers 32 (or both) may make use of one or more specialized services or appliances that may be deployed locally or remotely across one or more networks 31. For example, one or more databases 34 may be used or referred to by one or more embodiments of the invention. It should be understood by one having ordinary skill in the art that databases 34 may be arranged in a wide variety of architectures and using a wide variety of data access and manipulation means. For example, in various embodiments one or more databases 34 may comprise a relational database system using a structured query language (SQL), while others may comprise an alternative data storage technology such as those referred to in the art as NoSQL (for example, HADOOP CASSANDRA™, GOOGLE BIGTABLE™, and so forth). In some embodiments, variant database architectures such as column-oriented databases, in-memory databases, clustered databases, distributed databases, or even flat file data repositories may be used according to the invention. It will be appreciated by one having ordinary skill in the art that any combination of known or future database technologies may be used as appropriate, unless a specific database technology or a specific arrangement of components is specified for a particular embodiment herein. Moreover, it should be appreciated that the term database as used herein may refer to a physical database machine, a cluster of machines acting as a single database system, or a logical database within an overall database management system. Unless a specific meaning is specified for a given use of the term database, it should be construed to mean any of these senses of the word, all of which are understood as a plain meaning of the term database by those having ordinary skill in the art.

Similarly, most embodiments of the invention may make use of one or more security systems 36 and configuration systems 35. Security and configuration management are common information technology (IT) and web functions, and some amount of each are generally associated with any IT or web systems. It should be understood by one having ordinary skill in the art that any configuration or security subsystems known in the art now or in the future may be used in conjunction with embodiments of the invention without limitation, unless a specific security 36 or configuration system 35 or approach is specifically required by the description of any specific embodiment.

Figure 13:
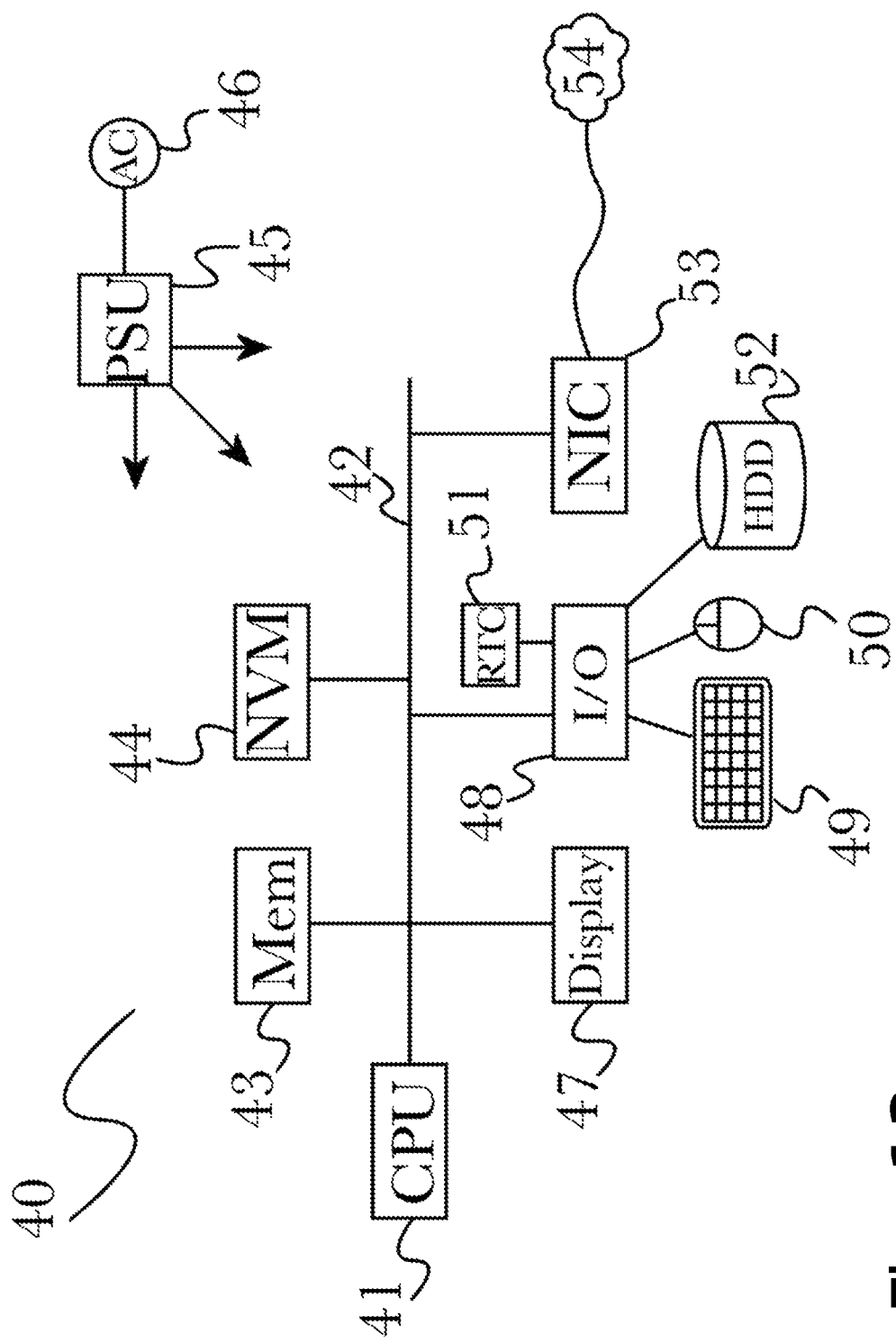
FIG. 13 is another block diagram illustrating an exemplary hardware architecture of a computing device.

FIG. 13 shows an exemplary overview of a computer system 40 as may be used in any of the various locations throughout the system. It is exemplary of any computer that may execute code to process data. Various modifications and changes may be made to computer system 40 without departing from the broader scope of the system and method disclosed herein. Central processor unit (CPU) 41 is connected to bus 42, to which bus is also connected memory 43, nonvolatile memory 44, display 47, input/output (I/O) unit 48, and network interface card (NIC) 53. I/O unit 48 may, typically, be connected to keyboard 49, pointing device 50, hard disk 52, and real-time clock 51. NIC 53 connects to network 54, which may be the Internet or a local network, which local network may or may not have connections to the Internet. Also shown as part of system 40 is power supply unit 45 connected, in this example, to a main alternating current (AC) supply 46. Not shown are batteries that could be present, and many other devices and modifications that are well known but are not applicable to the specific novel functions of the current system and method disclosed herein. It should be appreciated that some or all components illustrated may be combined, such as in various integrated applications, for example Qualcomm or Samsung system-on-a-chip (SOC) devices, or whenever it may be appropriate to combine multiple capabilities or functions into a single hardware device (for instance, in mobile devices such as smartphones, video game consoles, in-vehicle computer systems such as navigation or multimedia systems in automobiles, or other integrated hardware devices).

In various embodiments, functionality for implementing systems or methods of the present invention may be distributed among any number of client and/or server components. For example, various software modules may be implemented for performing various functions in connection with the present invention, and such modules may be variously implemented to run on server and/or client components.

The skilled person will be aware of a range of possible modifications of the various embodiments described above. Accordingly, the present invention is defined by the claims and their equivalents.

What is claimed is:

1. A system for abstract meta-model simulation creation and execution, comprising:
   a computing device comprising a memory, a processor, a non-volatile data storage device, and a display device;
   a domain-specific simulation model based on domain-specific language stored in the non-volatile data storage device, the domain-specific simulation model comprising actors, objects, and events, and a plurality of behaviors of the actors, the objects, and the events within a specific application domain;
   a probabilistic behavior interpreter comprising first plurality of programming instructions stored in the memory and operating on the processor, wherein the first plurality of programming instructions, when operating on the processor, cause the computing device to:
      retrieve the domain-specific simulation model from the non-volatile data storage device;
      calculate probabilistic behavior results based on the behaviors of the actors, objects, and events of the domain-specific simulation model, wherein the probabilistic behavior results include environment interactions, specific behaviors and outcomes of the specific behaviors;
      store the probabilistic behavior results as a behavior tree model in the non-volatile data storage device;
   a visual simulation model editor comprising second plurality of programming instructions stored in the memory and operating on the processor, wherein the second plurality of programming instructions, when operating on the processor, cause the computing device to:
      retrieve a meta-model specification for the meta-model simulation;
      graphically represent meta-model specification on the display device;

receive a modification of the graphical representation of the meta-model specification using a graphical user interface; and store the modified meta-model specification in the non-volatile data storage device;

wherein the meta-model specification is based at least on from the domain-specific simulation model and the behavior tree model and comprises a plurality of relationships between the domain-specific simulation model and a plurality of additional models outside the domain; and wherein the domain-specific simulation model may itself be used as an object in the meta-model specification with or within other domain-specific simulations;

a meta-model simulation execution environment comprising a third plurality of programming instructions stored in the memory and operating on the processor, wherein the third plurality of programming instructions, when operating on the processor, cause the computing device to:

retrieve the modified meta-model specification from the non-volatile data storage device; and execute the meta-model simulation based on the modified meta-model specification; and an internal heuristic comprising a fourth plurality of programming instructions stored in the memory and operating on the processor, wherein the fourth plurality of programming instructions, when operating on the processor, cause the computing device to:

receive data from the meta-model simulation when the meta-model simulation is being executed;

receive an input from a user when the user is connected to the meta-model simulation being executed as an active actor; and alter the simulation environment of the meta-model simulation being executed in response to the data from the meta-model simulation and the input from the user by parameterizing specific discrete objects, events, and actors in the received data of the meta-model simulation being executed.

2. The system of claim 1, wherein the computing device further comprises a web server, and the graphical user interface for meta-model modification is hosted as a website accessible by a web browser.

3. The system of claim 1, wherein the computing device further comprises a remote server, and the meta-model simulation is hosted on the remote server.

4. The system of claim 3, wherein a plurality of users may alter the execution of the meta-model simulation using the internal heuristic.

5. The system of claim 1, wherein the meta-model simulation execution environment is a cloud-based third-party simulation environment.

6. The system of claim 1, wherein at least part of the input taken from the user represents parameters for objects, events, or actors within the meta-model simulation being executed, wherein the simulation environment alteration further includes altering status of the specific discrete objects, events, and actors within the simulation environment to change the stored behaviors in the behavior trees or add new behaviors altogether.

7. A method for abstract meta-model simulation creation and execution, comprising the steps of:

storing a domain-specific simulation model based on domain specific language in a non-volatile data storage device, the domain-specific simulation model comprising actors, objects, and events, and a plurality of behaviors of the actors, the objects, and the events within a specific application domain;

calculating probabilistic behavior results based on the plurality of behaviors of the actors, objects, and events of the domain-specific simulation model, wherein the probabilistic behavior results include environment interactions, specific behaviors and outcomes of the specific behaviors;

storing the probabilistic behavior results as a behavior tree model in the non-volatile data storage device;

creating a meta-model specification from the domain-specific simulation model and the behavior tree model:

wherein the meta-model specification comprises a plurality of relationships between the domain-specific simulation model and a plurality of additional models outside the domain; and wherein the domain-specific simulation model may itself be used as an object in the meta-model specification with or within other domain-specific simulations, thereby nesting simulations to achieve complex behaviors within a meta-model simulation;

graphically representing the meta-model specification on a display device;

receiving a modification of the graphical representation of the meta-model specification using a graphical user interface;

executing a meta-model simulation based on the modified meta-model specification;

receiving data from the meta-model simulation when the meta-model simulation is being executed;

receiving an input from a user when the user is connected to the meta-model simulation being executed as an active actor.

8. The method of claim 7, wherein the graphical user interface for meta-model modification is hosted as a website accessible by a web browser.

9. The method of claim 7, wherein the meta-model simulation is hosted on a remote server.

10. The method of claim 9, wherein a plurality of users may use the remote server to alter the execution of the meta-model simulation using the internal heuristic.

11. The method of claim 7, wherein the meta-model simulation is executed on a cloud-based third-party simulation environment.

12. The method of claim 7, wherein at least part of the input taken from the user represents parameters for objects, events, or actors within the meta-model simulation being executed, wherein the simulation environment alteration further include altering status of the specific discrete objects, events, and actors within the simulation environment to change the stored behaviors in the behavior trees or add new behaviors altogether.

* * * * *